(12) United States Patent
Sahmuganathan et al.

(10) Patent No.: US 11,894,230 B2
(45) Date of Patent: Feb. 6, 2024

(54) TRIBOLOGICAL PROPERTIES OF DIAMOND FILMS

(71) Applicants: Applied Materials, Inc., Santa Clara, CA (US); National University of Singapore, Singapore (SG)

(72) Inventors: Vicknesh Sahmuganathan, Singapore (SG); Jiteng Gu, Singapore (SG); Eswaranand Venkatasubramanian, Santa Clara, CA (US); Kian Ping Loh, Singapore (SG); Abhijit Basu Mallick, Sunnyvale, CA (US); John Sudijono, Singapore (SG); Zhongxin Chen, Singapore (SG)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/101,317

(22) Filed: Jan. 25, 2023

(65) Prior Publication Data

US 2023/0170217 A1    Jun. 1, 2023

Related U.S. Application Data

(62) Division of application No. 17/007,441, filed on Aug. 31, 2020, now Pat. No. 11,594,416.

(51) Int. Cl.
  *H10B 41/27*   (2023.01)
  *H01L 21/033*  (2006.01)
  *H01L 21/311*  (2006.01)

(52) U.S. Cl.
  CPC ...... *H01L 21/0332* (2013.01); *H01L 21/0337* (2013.01); *H10B 41/27* (2023.02); *H01L 21/31122* (2013.01); *H01L 21/31144* (2013.01)

(58) Field of Classification Search
  CPC ............. H01L 21/0332; H01L 21/0334; H01L 21/0335; H01L 21/0337; H01L 21/0338
  See application file for complete search history.

(56) References Cited

U.S. PATENT DOCUMENTS

| 7,079,740 B2 | 7/2006 | Vandroux et al. |
| 9,502,262 B2 | 11/2016 | Chen et al. |

(Continued)

FOREIGN PATENT DOCUMENTS

| JP | S6468484 A | 3/1989 |
| JP | 2010533122 A | 10/2010 |

(Continued)

OTHER PUBLICATIONS

PCT International Search Report and Written Opinion in PCT/US2021/046095 dated Dec. 6, 2021, 11 pages.

(Continued)

*Primary Examiner* — Walter H Swanson
(74) *Attorney, Agent, or Firm* — Servilla Whitney LLC (57) ABSTRACT

Methods to manufacture integrated circuits are described. Nanocrystalline diamond is used as a hard mask in place of amorphous carbon. Provided is a method of processing a substrate in which nanocrystalline diamond is used as a hard mask, wherein processing methods result in a smooth surface. The method involves two processing parts. Two separate nanocrystalline diamond recipes are combined—the first and second recipes are cycled to achieve a nanocrystalline diamond hard mask having high hardness, high modulus, and a smooth surface. In other embodiments, the first recipe is followed by an inert gas plasma smoothening process and then the first recipe is cycled to achieve a high hardness, a high modulus, and a smooth surface.

6 Claims, 5 Drawing Sheets

(56) References Cited

U.S. PATENT DOCUMENTS

| | | |
|---|---|---|
| 2009/0022969 A1 | 1/2009 | Zhang et al. |
| 2010/0242834 A1 | 9/2010 | Bhandari |
| 2015/0294978 A1* | 10/2015 | Lu ..................... H01L 27/0688 |
| | | 438/269 |
| 2015/0315707 A1 | 11/2015 | Xue et al. |
| 2016/0053366 A1 | 2/2016 | Stowell et al. |
| 2017/0062216 A1 | 3/2017 | Chen et al. |

FOREIGN PATENT DOCUMENTS

| | | |
|---|---|---|
| JP | 2017533580 A | 11/2017 |
| JP | 2017534750 A | 11/2017 |
| JP | 2017226593 A | 12/2017 |
| JP | 6259915 B2 | 1/2018 |
| WO | 2016028640 A1 | 2/2016 |
| WO | 2016036533 A1 | 3/2016 |

OTHER PUBLICATIONS

Choi, Won Seok, et al., "Characterization of diamond-like carbon thin films prepared by a microwave plasma enhanced chemical vapor deposition method", Surface and Coatings Technology 180-181 (2004) 254-258.

Cicala, Grazia, et al., "Load sensitive super-hardness of nanocrystalline diamond coatings", Diamond & Related Materials 101 (2020) 107653.

Popov, C., et al., "Influence of the nucleation density on the structure and mechanical properties of ultrananocrystalline diamond films", Diamond & Related Materials 18 (2009) 151-154.

* cited by examiner

TRIBOLOGICAL PROPERTIES OF DIAMOND FILMS

CROSS-REFERENCE TO RELATED APPLICATIONS

This application is a Divisional of U.S. application Ser. No. 17/007,441, filed Aug. 31, 2020, the entire disclosure of which is hereby incorporated by reference herein.

TECHNICAL FIELD

Embodiments of the present disclosure pertain to the field of electronic device manufacturing, and in particular, to an integrated circuit (IC) manufacturing. More particularly, embodiments of the disclosure provide methods of depositing nanocrystalline diamond films.

BACKGROUND

As the semiconductor industry introduces new generations of integrated circuits (ICs) having higher performance and greater functionality, the density of the elements that form those ICs is increased, while the dimensions, size, and spacing between the individual components or elements are reduced. While in the past such reductions were limited only by the ability to define the structures using photo lithography, device geometries having dimensions measured in μm or nm have created new limiting factors, such as the conductivity of the metallic elements, the dielectric constant of the insulating material(s) used between the elements, or challenges in 3D NAND or DRAM processes. These limitations may benefit by more durable and higher hardness hard masks.

The direct way to reduce cost per bit and increase chip density in 3D NAND is by adding more layers. One of the critical steps in 3D NAND technology is slit etch prior to silicon nitride (SiN) recess for metal contact deposition. As the number of tiers increase in each technology node, to control the slit etch profile (uniform etching from top to bottom), the thickness of the hard mask has to be proportionally increased to withstand high aspect etch profiles. Traditionally, a very high-quality hard mask film, which has high etch selectivity, unparalleled hardness, and high density is used. Current hard mask films include pure or doped plasma enhanced chemical vapor deposition (PECVD) amorphous carbon (aC:H) based films due to high hardness and modulus, film transparency, and ease in removing after slit etching. PECVD amorphous carbon hard mask films, however, have problems with delamination/peeling at bevel (major issue in downstream etch process), becoming more opaque with thicker films (photo alignment issue), and poor morphology, leading to pillar striations, one sided bow, and pillar twisting.

Nanocrystalline diamond is known as a high hardness material which can be used as a hard mask in semiconductor device processing. Nanocrystalline diamond hard mask films, while having high hardness and modulus, have high surface roughness. Accordingly, there is a need for hard masks that have high hardness and modulus, but that have low surface roughness.

SUMMARY

Apparatuses and methods to manufacture integrated circuits are described. In one or more embodiments, a processing method is described. In one embodiment, a processing method comprises: depositing a first nanocrystalline diamond layer on a substrate, the first nanocrystalline diamond layer having a first thickness, a first roughness, a first hardness, and a first modulus; and depositing a second nanocrystalline diamond layer on the first nanocrystalline diamond layer, the second nanocrystalline diamond layer having a second thickness, and a second roughness, wherein the first thickness is greater than the second thickness, and the second roughness is less than the first roughness.

In other embodiments, a processing method comprises depositing a first nanocrystalline diamond layer on the seed layer, the first nanocrystalline diamond layer having a first thickness, a first roughness, a first hardness, and a first modulus; and exposing the first nanocrystalline diamond layer to an inert gas plasma to form a smooth nanocrystalline diamond layer.

In one or more embodiments, an electronic device is described. The memory device comprises: a memory stack comprising a plurality of alternating layers of a first material and a second material on a substrate; a nanocrystalline diamond layer on the memory stack, the nanocrystalline diamond layer has a roughness of less than about 15 nm; and a memory channel extending from a top surface of the memory stack to the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, gallium nitride, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

As used herein, the phrase "nanocrystalline diamond," refers a solid film of diamond typically grown on a substrate, such as silicon. The nanocrystallinity is the results of the enhanced re-nucleation reaction in diamond growth, where the growth of diamond crystal is disrupted due to the fluctuation of surrounding environments such as the amounts of radical species, temperature and pressure. The formation of diamond nuclei is determined by the hydrogen atoms which play an important role in driving external carbon atom adsorption and etching away the non-diamond phases, and it is believed to be the competition between diamond growth and etching. Nanocrystalline diamond are mainly comprised of small diamond crystal in nanospheres or nanocolumnar shape, and the amorphous carbon distributed usually distribute in the positions between surrounding crystals or accumulate in the grain boundaries. Nanocrystalline diamond is used as a hard mask material in semiconductor applications because of its chemical inertness, optical transparency, and good mechanical properties.

In one or more embodiments, plasma enhanced chemical vapor deposition (PECVD) is widely used to deposit nanocrystalline diamond films due to cost efficiency and film property versatility. In a PECVD process, a hydrocarbon source, such as a gas-phase hydrocarbon or vapors of a liquid-phase hydrocarbon that have been entrained in a carrier gas, is introduced into a PECVD chamber. Plasma is then initiated in the chamber to create excited CH-radicals. The excited CH-radicals are chemically bound to the surface of a substrate positioned in the chamber, forming the desired nanocrystalline diamond films thereon. Embodiments described herein in reference to a PECVD process can be carried out using any suitable thin film deposition system. Examples of suitable systems include the CENTURA® systems which may use a DXZ® processing chamber, PRECISION 5000® systems, PRODUCER® systems, PRODUCER® GTTM systems, PRODUCER® XP Precision™ systems, PRODUCER® SETM systems, Sym3® processing chamber, and Mesa™ processing chamber, all of which are commercially available from Applied Materials, Inc., of Santa Clara, Calif. Other tools capable of performing PECVD processes may also be adapted to benefit from the embodiments described herein. In addition, any system enabling the PECVD processes described herein can be used to advantage. Any apparatus description described herein is illustrative and should not be construed or interpreted as limiting the scope of the implementations described herein.

Device manufacturers using a carbon-based hard mask layer demand critical requirements be met: (1) high selectivity of the hard mask during the dry etching of underlying materials, (2) low film roughness, (3) low film stress, and (4) film strip ability. As used herein, the term "dry etching" generally refers to etching processes where a material is not dissolved by immersion in a chemical solution and includes methods such as plasma etching, reactive ion etching, sputter etching, and vapor phase etching.

In one or more embodiments, a nanocrystalline diamond layer is formed on a substrate. The process of one or more embodiments advantageously produces a nanocrystalline diamond layer with high density, high hardness, high etch selectivity, low stress and excellent thermal conductivity.

Hard masks are used as etch stop layers in semiconductor processing. Ashable hard masks have a chemical composition that allows them to be removed by a technique referred to as ashing once they have served their purpose. An ashable hard mask is generally composed of carbon and hydrogen with trace amounts of one or more dopants (e.g., nitrogen, fluorine, boron, silicon). In a typical application, after etching, the hard mask has served its purpose and is removed from the underlying layer. This is generally accomplished, at least in part, by ashing, also referred to as "plasma ashing" or "dry stripping." Substrates with hard masks to be ashed, generally partially fabricated semiconductor wafers, are placed into a chamber under vacuum, and oxygen is introduced and subjected to radio frequency power, which creates oxygen radicals (plasma). The radicals react with the hard mask to oxidize it to water, carbon monoxide, and carbon dioxide. In some instances, complete removal of the hard mask may be accomplished by following the ashing with additional wet or dry etching processes, for example when the ashable hard mask leaves behind any residue that cannot be removed by ashing alone.

Hard mask layers are often used in narrow and/or deep contact etch applications, where photoresist may not be thick enough to mask the underlying layer. This is especially applicable as the critical dimension shrinks.

V-NAND, or 3D-NAND, structures are used in flash memory applications. V-NAND devices are vertically stacked NAND structures with a large number of cells arranged in blocks. As used herein, the term "3D NAND" refers to a type of electronic (solid-state) non-volatile computer storage memory in which the memory cells are stacked in multiple layers. 3D NAND memory generally includes a plurality of memory cells that include floating-gate transistors. Traditionally, 3D NAND memory cells include a plurality of NAND memory structures arranged in three dimensions around a bit line.

A critical step in 3D NAND technology is slit etch. As the number of tiers increases in each technology node, to control the slit etch profile, the thickness of the hard mask film has to proportionally increase to withstand high aspect etch profiles. Currently, amorphous carbon (aC:H) films are used due to high hardness and easy to strip after slit etch. However, amorphous carbon hard mask films have delamination at bevel and poor morphology, leading to pillar striations.

Tribology is the science and engineering of interacting surfaces in relative motion. Tribology includes the study and application of the principles of friction, lubrication, and wear. In one or more embodiments, nanocrystalline diamond is advantageously used as a hard mask in place of amorphous carbon. Nanocrystalline diamond hard mask films provide high hardness and high modulus, but can result in high levels of surface roughness. Accordingly, in one or more embodiments, provided is a method of processing a substrate in which nanocrystalline diamond is used as a hard mask, wherein processing methods result in a smooth surface. The method of one or more embodiments involves two processing parts. In one embodiment, two separate nanocrystalline diamond recipes are combined—the first recipe provides high hardness and high modulus and the second recipe provides a smooth surface. The first and second recipes are cycled to achieve a nanocrystalline diamond hard mask having high hardness, high modulus, and a smooth surface. In other embodiments, the first recipe is followed by an inert gas plasma smoothening process and then the first recipe is cycled to achieve a high hardness, a high modulus, and a smooth surface.

The processing methods of one or more embodiments advantageously preserve the nanocrystalline diamond hard mask film's hardness and modulus while keeping the surface roughness low. With the nanocrystalline diamond hard mask film's high hardness, high modulus and improved surface roughness, the film can be used as a hard mask to overcome the challenges faced in the amorphous carbon-based films.

In one or more embodiments, to achieve greater etch selectivity, the density and, more importantly, the Young's modulus of the nanocrystalline diamond layer 108, 208 is improved. One of the main challenges in achieving greater etch selectivity and improved Young's modulus is the high compressive stress of such a film making it unsuitable for applications owing to the resultant high wafer bow. Hence, there is a need for nanocrystalline diamond films with high-density and modulus (e.g., higher spa content) with high etch selectivity along with low stress (e.g., <−500 MPa).

Embodiments described herein, include improved methods of fabricating nanocrystalline diamond hard mask films with high-density (e.g., >1.8 g/cc), high Young's elastic modulus (e.g., >150 GPa), and low stress (e.g., <−500 MPa). In one or more embodiments, the Young's modulus is measured at room temperature, or at ambient temperature, or at a temperature in the range of from about 22° C. to about 25° C. In one or more embodiments, Young's modulus of the nanocrystalline diamond film may be greater than 250 GPa. In other embodiments, Young's modulus of the nanocrystalline diamond film may be greater than 300 GPa, or greater than 350 GPa.

In one or more embodiment, the density of the nanocrystalline diamond film is greater than about 3.0 g/cc.

FIGS. 1A-1D illustrate schematic cross-sectional views of a substrate 100 at different stages of an integrated circuit fabrication sequence, the first recipe, incorporating a nanocrystalline diamond layer as a hard mask. In FIGS. 1A-1D, the nanocrystalline diamond layer 108 that is deposited has a thickness, $T_1$, a high modulus (E>250 GPa) and a high surface roughness (Ra>25 nm). In one or more embodiments, the first nanocrystalline diamond layer 108 has a thickness, $T_1$, in a range of from about 250 nm to about 650 nm. In one or more embodiments, the roughness of the nanocrystalline diamond layer 108, as measured by atomic force microscopy (AFM), is greater than 25 nm.

FIGS. 2A-2D illustrate schematic cross-sectional views of a substrate 200 at different stages of an integrated circuit fabrication sequence, the second recipe, incorporating a nanocrystalline diamond layer as a hard mask. In FIGS. 2A-2D, the nanocrystalline diamond layer 208 that is deposited has a thickness, $T_2$, a high modulus (E>250 GPa) and a low surface roughness (Ra<15 nm). In one or more embodiments, the second nanocrystalline diamond layer 208 has a thickness, $T_2$, in a range of from about 5 nm to about 200 nm. In one or more embodiments, the roughness of the nanocrystalline diamond layer 208, as measured by atomic force microscopy (AFM), is less than about 15 nm.

Figure 1A:
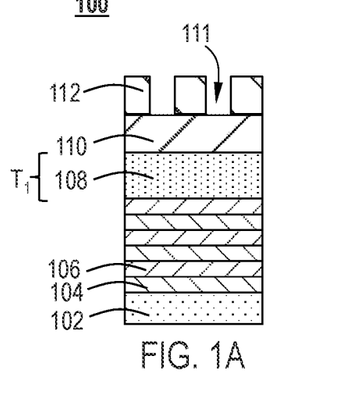
FIG. 1A illustrates a cross-sectional view of a substrate according to one or more embodiments.

FIG. 1A illustrates a cross-sectional view of a device 100. In one or more embodiments, the device 100 may be a NAND device. The device 100 includes a substrate 102, a plurality of device layers 104, 106, a nanocrystalline diamond mask layer 108 formed on the plurality of device layers 104, 106.

Figure 2A:
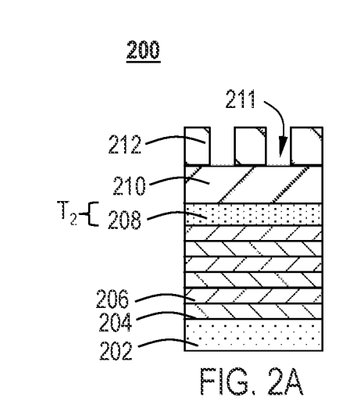
FIG. 2A illustrates a cross-sectional view of a substrate according to one or more embodiments.

FIG. 2A illustrates a cross-sectional view of a device 200. In one or more embodiments, the device 200 may be a NAND device. The device 200 includes a substrate 202, a plurality of device layers 204, 206, a nanocrystalline diamond mask layer 208 formed on the plurality of device layers 204, 206.

In one or more embodiments, the substrate 102, 202 can be any semiconducting substrate known in the art, such as monocrystalline silicon, IV-IV compounds such as silicon-germanium (Si—Ge) or silicon-germanium-carbon (Si—Ge—C), III-V compounds, II-VI compounds, epitaxial layers over such substrates, or any other semiconducting or non-semiconducting material, such as silicon oxide, glass, plastic, metal or ceramic substrate. In one or more embodiments, the substrate 102, 202 may include integrated circuits fabricated thereon, such as driver circuits for a memory device (not shown).

In one or more embodiments, the plurality of device layers 104, 106, 204, 206 can be formed over the surface of the substrate 102, 202. The plurality of device layers 104, 106, 204, 206 can be deposited layers which form components of a 3D vertical NAND structure. Components may be formed by all or part of the plurality of device layers (e.g., dielectrics, or discrete charge storage segments). The dielectric portions may be independently selected from any one or more same or different electrically insulating materials, such as silicon oxide, silicon nitride, silicon oxynitride, or other high-k insulating materials. In one embodiment, the structure can comprise silicon oxide/silicon nitride pairs deposited in an alternating fashion. The pairs can be between 100 and 600 Å in total height. The number of pairs can be greater than 10 pairs, such as 32 pairs, 64 pairs or greater.

In one or more embodiments, the nanocrystalline diamond layer 108, 208 is a crystalline carbon layer with a high $sp^3$ content and a small crystal size. The most common chemical bonds in amorphous and nanocrystalline carbon are threefold ($sp^2$ bonding) and fourfold ($sp^3$) bonding coordination. In the $sp^3$ configuration, a carbon atom forms four $sp^3$ orbitals making a strong sigma bond to the adjacent atom. In carbon films with high $sp^3$ content, the $sp^3$ content is greater than 80%, such as greater than about 90% or greater than about 95%. The nanocrystalline diamond layer 108, 208 has a high $sp^3$ content (e.g., nanocrystalline diamond grains) and is supported by an $sp^2$ matrix (e.g., graphite). As used herein, small crystal size is a crystal size of less than 6 nm, such as between 2 nm and 5 nm.

In one or more embodiments, the nanocrystalline diamond layer 108 produced by the first recipe has a surface roughness with a root mean square of height deviation of greater than 25 nm. In one or more embodiments, the first recipe may comprise a gas flow of methane ($CH_4$)/carbon dioxide ($CO_2$)/hydrogen ($H_2$) in a range of flow rate making the total flow of 100%. The nanocrystalline diamond film is deposited using a range of microwave power of 2 to 12 kW, a pressure of 0.1 to 1 Torr, and a temperature of 500° C. to 650° C.

In one or more embodiments, the nanocrystalline diamond layer 208 produced by the second recipe has a surface roughness with a root mean square of height deviation of less than about 15 nm. In one or more embodiments, the second recipe may comprise a gas flow of methane ($CH_4$)/carbon dioxide ($CO_2$)/hydrogen ($H_2$)/argon (Ar) in a range of flow rate making total flow of 100%. The nanocrystalline diamond film is deposited using a range of microwave power of 2 to 12 kW, pulsed at 10-90%, a pressure of 0.1 to 1 Torr, and a temperature of 500° C. to 650° C.

In one or more embodiments, the nanocrystalline diamond layer 108, 208 has a density of between 2.5 $g/cm^3$ and 3.5 $g/cm^3$, such as a density of 3 $g/cm^3$. In one or more embodiments, the nanocrystalline diamond layer 108, 208 has a stress of between −50 MPa and −150 MPa, such as a stress of between −80 MPa and −120 MPa. The nanocrystalline diamond layer 108, 208 has a blanket etch selectivity of between 2 and 4.

Figure 1B:
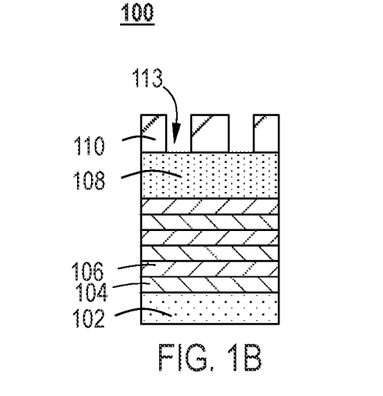
FIG. 1B illustrates a cross-sectional view of a substrate according to one or more embodiments.
Figure 2B:
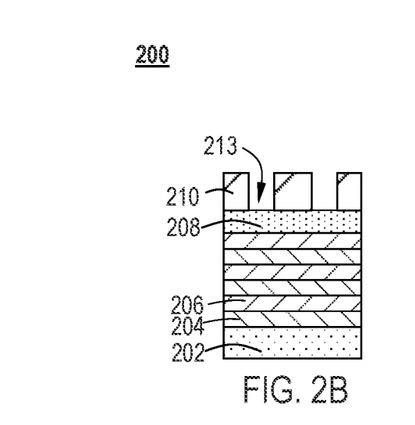
FIG. 2B illustrates a cross-sectional view of a substrate according to one or more embodiments.

In some embodiments, an anti-reflective coating 110, 210 is on the nanocrystalline diamond layer 108, 208, and a photoresist 112, 212 is on the anti-reflective coating 110, 210. In some embodiments, the anti-reflective coating 110, 210 is a dielectric anti-reflective coating (DARC). Referring to FIG. 1B and FIG. 2B, the anti-reflective coating 110, 210 is patterned for form openings 113, 213 that expose portions of a top surface of the nanocrystalline diamond layer 108, 208.

With reference to FIGS. 1C and 1D and FIGS. 2C and 2D, the device 100, 200 comprises a channel 114, 214. The channel 114, 214 is formed through the nanocrystalline diamond layer 108, 208 and the plurality of device layers 104, 106, 204, and 206. The channel 114, 214 can be substantially perpendicular to a top surface of the substrate 102, 202. For example, the channel 114, 214 may have a pillar shape. The channel 114, 214 can extend substantially perpendicularly to the top surface of the substrate 102, 202. In some embodiments, the channel 114, 214 may be a filled feature. In some other embodiments, the channel 114, 214 may be hollow. In such embodiments, an insulating fill material (not illustrated) may be formed to fill the hollow part surrounded by the channel 114, 214. The insulating fill material may comprise any electrically insulating material, such as silicon oxide, silicon nitride, silicon oxynitride, or other high-k insulating materials.

Figure 1C:
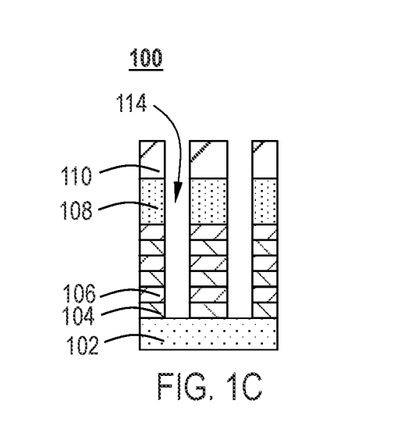
FIG. 1C illustrates a cross-sectional view of a substrate according to one or more embodiments.
Figure 1D:
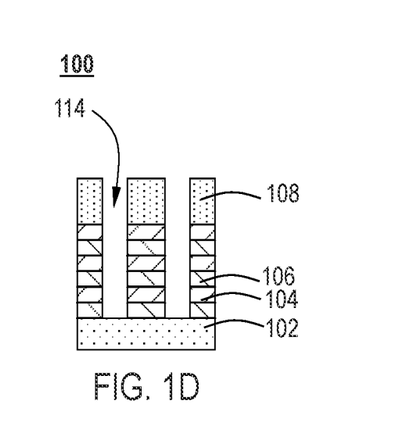
FIG. 1D illustrates a cross-sectional view of a substrate according to one or more embodiments.
Figure 2C:
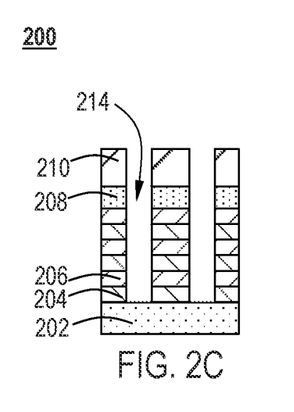
FIG. 2C illustrates a cross-sectional view of a substrate according to one or more embodiments.
Figure 2D:
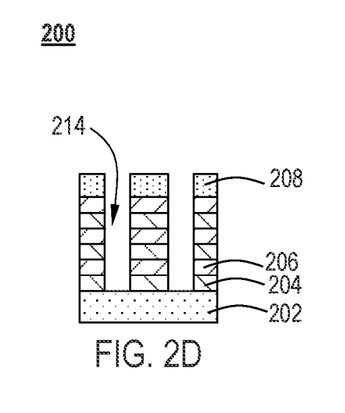
FIG. 2D illustrates a cross-sectional view of a substrate according to one or more embodiments.

Referring to FIG. 1D and FIG. 2D, in one or more embodiments, after the channel 114, 214 is formed, the anti-reflective coating 110, 210 may be removed.

Any suitable semiconductor materials can be used for the channel 114, 214, for example silicon, germanium, silicon germanium, or other compound semiconductor materials, such as III-V, II-VI, or conductive or semi-conductive oxides, or other materials. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In other embodiments, the semiconductor channel material may be a recrystallized polycrystalline semiconductor material formed by recrystallizing an initially deposited amorphous semiconductor material.

In one or more embodiments, the nanocrystalline diamond layer 108 produced according to the first recipe has a thickness, $T_1$. In one or more embodiments, the nanocrystalline diamond layer 108 has a thickness, $T_1$, in the range of about 500 Å to about 10,000 Å. Depending on the etch chemistry of the energy sensitive resist material 112 used in the fabrication sequence, an optional capping layer (not shown) may be formed on nanocrystalline diamond layer 108 prior to the formation of energy sensitive resist material 112. The optional capping layer functions as a mask for the nanocrystalline diamond layer 108 when the pattern is transferred therein and protects nanocrystalline diamond layer 108 from energy sensitive resist material 112.

In one or more embodiments, the nanocrystalline diamond layer 208 produced according to the second recipe has a thickness, $T_2$. In one or more embodiments, the nanocrystalline diamond layer 208 has a thickness, $T_2$, in the range of about 100 Å to about 500 Å.

As depicted in FIG. 1A and FIG. 2A, energy sensitive resist material 112, 212 may be formed on nanocrystalline diamond layer 108, 208. The layer of energy sensitive resist material 112, 212 can be spin-coated on the substrate to a thickness within the range of about 2000 Å to about 6000 Å. Most energy sensitive resist materials are sensitive to ultraviolet (UV) radiation having a wavelength less than about 450 nm, and for some applications having wavelengths of 245 nm or 193 nm. A pattern is introduced into the layer of energy sensitive resist material 112, 212. After energy sensitive resist material 112, 212 has been developed, the desired pattern, consisting of apertures/openings 111, 211, is present in energy sensitive resist material 112, 212, as shown in FIG. 1A and FIG. 2A. Thereafter, referring to FIG. 1B and FIG. 2B, the pattern defined in energy sensitive resist material 112, 212 is transferred through the anti-reflective coating 110, 210 using the energy sensitive resist material 110, 210 as a mask and forming openings/apertures 113, 213.

Referring to FIG. 1C and FIG. 2C, the pattern defined in anti-reflective coating 110, 210 is transferred through the nanocrystalline diamond layer 108, 208. An appropriate chemical etchant is used that selectively etches nanocrystalline diamond layer 108, 208 over the energy sensitive resist material 110, 210 and the plurality of material layers 104, 106, 204, 206 extending apertures 113, 213 to the substrate 102, 202 forming channel 114, 214. Appropriate chemical etchants include ozone, oxygen, or ammonia plasmas.

Current carbon hard mask films are deposited at very high temperatures and have low hydrogen (H) content, but the films are largely $sp^2$, resulting in lower density and modulus, leading to lower etch selectivity and pattern integrity. Modulus is a measurement of the mechanical strength of the film. Films, particularly thick films, with low modulus have line wiggling and other issues.

Figure 3A:
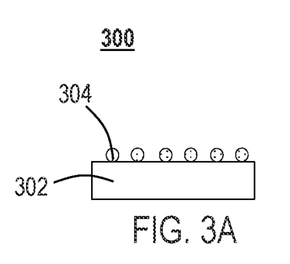
FIG. 3A illustrates a cross-sectional view of a substrate according to one or more embodiments.
Figure 3B:
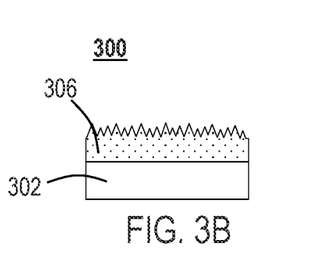
FIG. 3B illustrates a cross-sectional view of a substrate according to one or more embodiments.
Figure 3C:
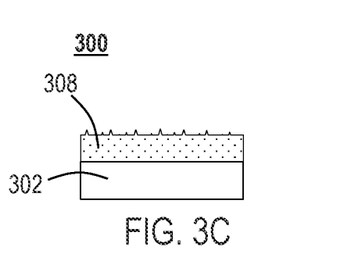
FIG. 3C illustrates a cross-sectional view of a substrate according to one or more embodiments.
Figure 5:
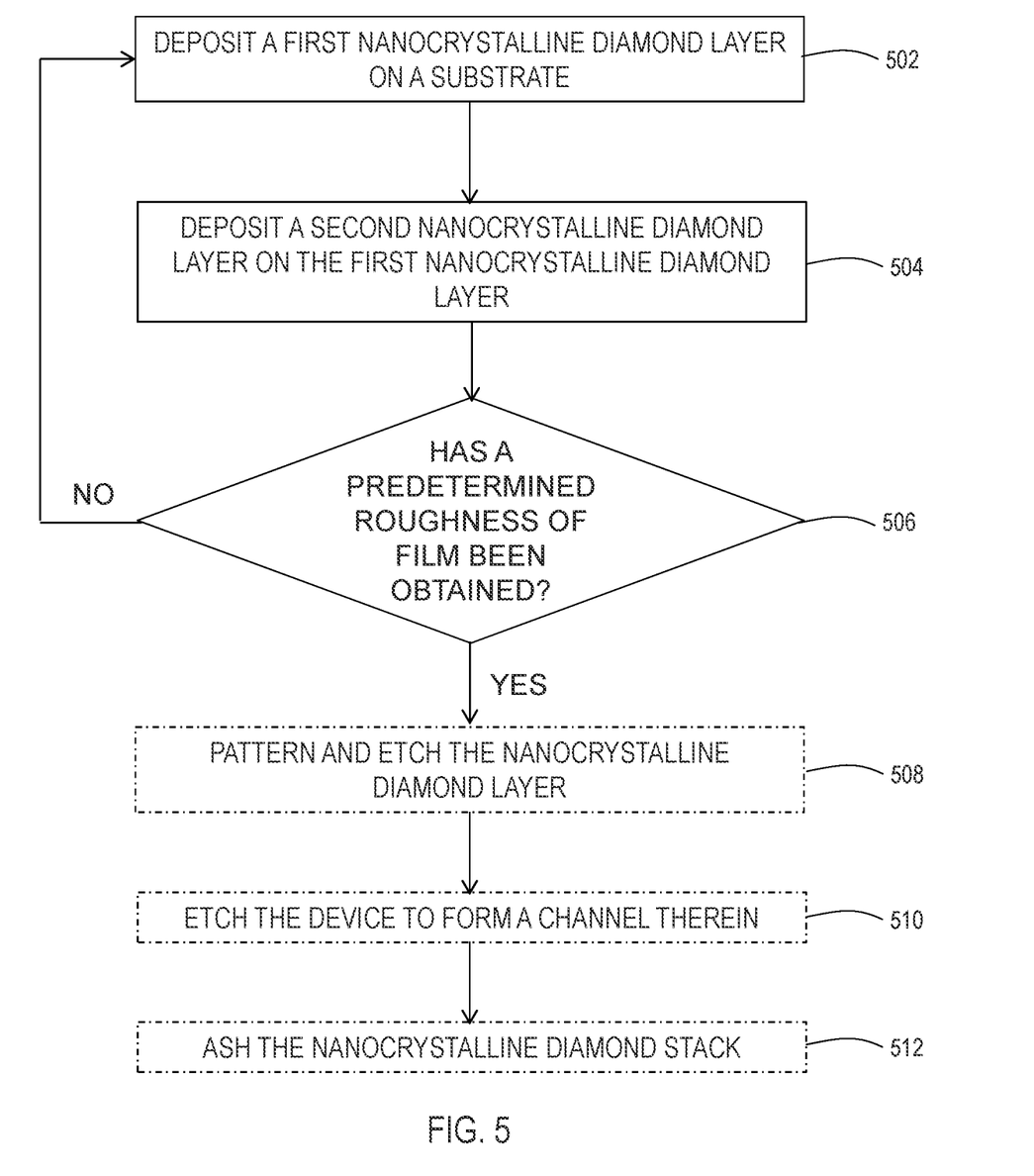
FIG. 5 illustrates a flow diagram of a method according to one or more embodiments.

FIGS. 3A-3C illustrate cross-sectional views of a device 300 being processed according to method of one or more embodiments. FIG. 5 illustrates a process flow diagram of a method 500 according to one or more embodiments. In some embodiments, a substrate is provided for processing prior to operation 502. As used in this regard, the term "provided" means that the substrate is placed into a position or environment for further processing. In one or more embodiments, the substrate is maintained at a temperature in a range of from about 200° C. to about 1000° C., including a range of from about 500° C. to about 650° C.

In one or more embodiments, the process chamber used can be any CVD process chamber with a plasma source (e.g. remote, microwave, capacitively coupled plasma (CCP), or inductively coupled plasma (ICP)), such as one of the process chambers described above. In some embodiments, flow rates and other processing parameters described below are for a 300 mm substrate. It should be understood these parameters can be adjusted based on the size of the substrate processed and the type of chamber used without diverging from the embodiments disclosed herein.

A "substrate surface", as used herein, refers to any substrate or material surface formed on a substrate upon which film processing can be performed. For example, a substrate surface on which processing can be performed includes materials such as silicon, silicon oxide, silicon nitride, doped silicon, germanium, gallium arsenide, gallium nitride, glass, sapphire, and any other materials such as metals, metal nitrides, metal alloys, and other conductive materials, depending on the application. A substrate surface may also include dielectric materials such as silicon dioxide and carbon doped silicon oxides. Substrates may have various dimensions, such as 200 mm, 300 mm, or other diameter wafers, as well as rectangular or square panes.

A device layer can then be deposited on the processing surface. The device layer can be a device layer as described with reference to FIGS. 1A-1D and FIGS. 2A-2D. Further, the device layer can be one of a plurality of device layers. The device layers can act in conjunction to form one or more features or components, such as components of a 3D NAND device.

At operation 502, a first nanocrystalline diamond layer is deposited on the substrate, or, in some embodiments, on the device layer. The first nanocrystalline diamond layer can have an average grain size of less than 6 nm. In one example, the first nanocrystalline diamond layer has an average grain size of between 2 nm and 5 nm. A small grain size, such as below 6 nm, allows for better control of adhesion between the hard mask layer, such as the nanocrystalline diamond layer, and the underlying layer and smaller size for the hard mask layer. The random positioning of a larger grain size during deposition will increase the number of non-contact spaces between the hard mask layer and the underlying layer. The non-contact space is the space between the hard mask layer and the underlying layer where the hard mask layer is not in direct contact with the underlying layer due to shape and size of the grains of the hard mask layer and due to the roughness of the underlying layer itself. A larger non-contact space decrease the adhesion of the layer and decreases the thermal transfer between the hard mask and the underlying layer. The size of non-contact space is reduced by smaller grains, because smaller grains, when deposited as part of a layer, can be more tightly packed than larger grains. Further, due to the smaller grain size, the layer can be made thinner than larger grain size layers while maintaining good contact with the underlying layer.

The deposition of the first nanocrystalline diamond layer at operation 502 can begin by delivering a deposition gas to a CVD process chamber with a plasma source (e.g. remote, microwave, CCP, or ICP) at a first pressure. The deposition gas includes a carbon-containing precursor and a hydrogen containing gas. In one or more embodiments, the carbon-containing precursor is an alkane precursor. The alkane precursor can be a saturated unbranched hydrocarbon, such as methane, ethane, propane, and combinations thereof. Other alkane precursors include n-butane, n-pentane, n-hexane, n-heptane, n-octane, and combinations thereof. The hydrogen containing gas can include hydrogen ($H_2$), water ($H_2O$), ammonia ($NH_3$) or other hydrogen containing molecules.

The deposition gas is then delivered to the CVD process chamber. The deposition gas can either mix within the chamber or be mixed prior to entering the chamber. The deposition gas is delivered at a relatively high pressure, such as greater than 5 Torr. In one embodiment, the deposition gas is delivered at between about 10 Torr and 100 Torr, such as about 50 Torr.

The deposition gas can then be activated to create an activated deposition gas. The deposition gas can be activated by forming a plasma using a power source. Any power source capable of activating the gases into reactive species and maintaining the plasma of reactive species may be used. For example, radio frequency (RF), direct current (DC), or microwave (MW) based power discharge techniques may be used. The power source produces a source plasma power which is applied to the CVD process chamber with a plasma source (e.g. remote, microwave, CCP, or ICP) to generate and maintain a plasma of the deposition gas. In embodiments which use an RF power for the source plasma power, the source plasma power can be delivered at a frequency of from about 2 MHz to about 170 MHz and at a power level of between 500 W and 12,000 W. Other embodiments include delivering the source plasma power at from about 2000 W to about 12,000 W. The power applied can be adjusted according to size of the substrate being processed. In one or more embodiments, the microwave plasma is applied as a continuous wave at a power in a range of about 2 to about 12 kilo watts (kW).

Based on the high pressure in the CVD chamber, as well as other factors, ionized species formation will be minimized while radical formation is maximized. Without intending to be bound by theory, it is believed that the nanocrystalline diamond layer should be primarily $sp^3$ bonds rather than $sp^2$ bonds. Further, it is believed that more $sp^3$ bonding can be achieved by increasing the number of radical species over ionized species during the deposition of the layer. Ionized species are highly energetic can need more room for movement than radicals. By increasing the pressure, electron energy is reduced while the likelihood of collision with other molecules increases. The decrease in electron energy and increase in number of collisions favors radical formation over ion formation.

Once activated, the activated deposition gas is then delivered through a second volume having a second pressure. The second volume can be a second chamber or another confined area between the process volume and the CVD chamber with a plasma source. In one example, the second volume is the connection between the CVD chamber with a plasma source and the process volume.

The second pressure is less than the first pressure. The movement from the remote plasma chamber to the second volume either based on flow rate, change in overall volume or combinations thereof results in a reduced pressure of the activated deposition gas in the second volume. The pressure is reduced to allow for better deposition from the radical species while reducing ionized species collision with the deposited layer. In one embodiment, the second pressure is between about 0.1 Torr and about 5 Torr. In one or more embodiments, the second pressure is in a range of about 0.1 Torr to about 1 Torr.

In one or more embodiments, the activated deposition gas comprising methane ($CH_4$)/carbon dioxide ($CO_2$) at a range of flow rate of about 2 sccm to about 10 sccm is then delivered to a substrate in a process volume of a process chamber. The substrate can be of any composition, such as a crystalline silicon substrate. The substrate can also include one or more features, such as a via or an interconnect. The substrate can be supported on a substrate support. The substrate support can be maintained in a specific temperature range. In one embodiment, the substrate support is maintained in a temperature range of between about 500° C. and about 650° C.

As illustrated in FIG. 3A, the substrate 302 can be preseeded for deposition of the nanocrystalline layer. In one embodiment, the substrate 302 is immersed or otherwise coated in a seeding solution to form suspended nanodiamonds 304 on the substrate 302. The seeding solution may be an ethanol based nanodiamond suspension. The substrate 302 may be immersed in the suspension during an ultrasonic treatment, which adheres some of the suspended nanodiamonds 304 to the surface of the substrate 302. Other preseeding techniques can be employed without diverging from the embodiments described herein.

Referring to FIG. 3B, a first nanocrystalline diamond layer 306 is then deposited on a surface of the substrate 302. The radicals from the previously formed activated deposition gas impinge on the substrate surface to form the first nanocrystalline diamond layer 306. Low pressure is believed to be beneficial to the formation of $sp^3$ bonding in the first nanocrystalline diamond layer 306 from the remotely formed radicals. The higher pressure in the CVD plasma chamber allows for preferential radical formation while the lower pressure in the process volume allows for more uniform deposition from the previously formed radicals.

Once the first nanocrystalline diamond layer 306 is deposited, a hydrogen containing gas is delivered to the CVD plasma chamber. The hydrogen containing gas can be delivered at a separate time or the gas flow from the previous step can be maintained. No alkane precursor is present for this portion. The hydrogen containing gas can be delivered with an inert gas or as part of a combination of multiple hydrogen containing gases. In one or more embodiments, the hydrogen ($H_2$) gas is delivered with a range of flow rate of about 90 sccm to about 96 sccm.

The hydrogen containing gas is then activated to create an activated hydrogen containing gas. The hydrogen containing gas can be converted to a plasma using the same pressure, temperature, power type, power ranges and other parameters for formation of the plasma discussed with reference to forming the activated deposition gas.

Once the activated hydrogen containing gas is formed, it can be delivered to the substrate in the process volume. The process volume and the substrate may be maintained at the same pressure, temperature and other parameters as described above. During the deposition process, it is believed that polymers can form on the surface of the deposited nanocrystalline diamond layer. The polymers can affect further deposition and otherwise degrade performance of the deposited layer. By delivering the activated hydrogen containing gas to the deposited layer, the polymers are made volatile and can then be removed from the chamber, such that they do not affect subsequent deposition processes.

The above elements can then be repeated to deposit a second nanocrystalline diamond layer 308 with a lower roughness than the first nanocrystalline diamond layer 306. At operation 504 a second nanocrystalline diamond layer 308 is deposited on the first nanocrystalline diamond layer. The second nanocrystalline diamond layer can have an average grain size of less than 6 nm. In one example, the second nanocrystalline diamond layer has an average grain size of between 2 nm and 5 nm. A small grain size, such as below 6 nm, allows for better control of adhesion between the hard mask layer, such as the second nanocrystalline diamond layer, and the underlying layer and smaller size for the hard mask layer. The random positioning of a larger grain size during deposition will increase the number of non-contact spaces between the hard mask layer and the underlying layer. The non-contact space is the space between the hard mask layer and the underlying layer where the hard mask layer is not in direct contact with the underlying layer due to shape and size of the grains of the hard mask layer and due to the roughness of the underlying layer itself. A larger non-contact space decrease the adhesion of the layer and decreases the thermal transfer between the hard mask and the underlying layer. The size of non-contact space is reduced by smaller grains, because smaller grains, when deposited as part of a layer, can be more tightly packed than larger grains. Further, due to the smaller grain size, the layer can be made thinner than larger grain size layers while maintaining good contact with the underlying layer.

The deposition of the second nanocrystalline diamond layer at operation 504 can begin by delivering a deposition gas to a CVD plasma chamber at a first pressure. The deposition gas includes a carbon-containing precursor and a hydrogen containing gas. In one or more embodiments, the carbon-containing precursor is an alkane precursor. The alkane precursor can be a saturated unbranched hydrocarbon, such as methane, ethane, propane, and combinations thereof. Other alkane precursors include n-butane, n-pentane, n-hexane, n-heptane, n-octane, and combinations thereof. The hydrogen containing gas can include hydrogen ($H_2$), water ($H_2O$), ammonia ($NH_3$) or other hydrogen containing molecules. The deposition gas can further include an inert gas. The inert gas can be a noble gas, such as argon (Ar).

The deposition gas is then delivered to the CVD plasma chamber. The deposition gas can either mix within the chamber or be mixed prior to entering the chamber. The deposition gas is delivered at a relatively high pressure, such as greater than 5 Torr. In one embodiment, the deposition gas is delivered at between about 10 Torr and 100 Torr, such as about 50 Torr.

The deposition gas can then be activated to create an activated deposition gas. The deposition gas can be activated by forming a plasma using a power source. Any power source capable of activating the gases into reactive species and maintaining the plasma of reactive species may be used. For example, radio frequency (RF), direct current (DC), or microwave (MW) based power discharge techniques may be used. The power source produces a source plasma power which is applied to the CVD plasma chamber to generate and maintain a plasma of the deposition gas. In embodiments which use an RF power for the source plasma power, the source plasma power can be delivered at a frequency of from about 2 MHz to about 170 MHz and at a power level of between 500 W and 12,000 W. Other embodiments include delivering the source plasma power at from about 2000 W to about 12,000 W. The power applied can be adjusted according to size of the substrate being processed.

Based on the high pressure in the remote plasma chamber, as well as other factors, ionized species formation will be minimized while radical formation is maximized. Without intending to be bound by theory, it is believed that the nanocrystalline diamond layer should be primarily $sp^3$ bonds rather than $sp^2$ bonds. Further, it is believed that more $sp^3$ bonding can be achieved by increasing the number of radical species over ionized species during the deposition of the layer. Ionized species are highly energetic can need more room for movement than radicals. By increasing the pressure, electron energy is reduced while the likelihood of collision with other molecules increases. The decrease in electron energy and increase in number of collisions favors radical formation over ion formation.

Once activated, the activated deposition gas comprising methane ($CH_4$)/carbon dioxide ($CO_2$)/argon (Ar) at a range of flow rate of 2-10/2-10/2-90 sccm is then delivered through a second volume having a second pressure. The second volume can be a second chamber or another confined area between the process volume and the CVD plasma chamber. In one example, the second volume is the connection between the CVD plasma chamber and the process volume.

The second pressure is less than the first pressure. The movement from the CVD plasma chamber to the second volume either based on flow rate, change in overall volume or combinations thereof results in a reduced pressure of the activated deposition gas in the second volume. The pressure is reduced to allow for better deposition from the radical species while reducing ionized species collision with the deposited layer. In one embodiment, the second pressure is between about 0.1 Torr and about 5 Torr. In one or more embodiments, the second pressure is in a range of from about 0.1 Torr to about 1 Torr.

The activated deposition gas, a mixture of methane ($CH_4$)/carbon dioxide ($CO_2$)/argon (Ar) is then delivered to a substrate in a process volume of a process chamber with a range of flow rate of about 2-10/2-10/2-90 sccm, respectively. In one embodiment, the substrate support is maintained in a temperature range of between about 500° C. and about 650° C.

A second nanocrystalline diamond layer 308 is then deposited on a surface of the first nanocrystalline diamond layer 306. The radicals from the previously formed activated deposition gas impinge on the surface to form the second nanocrystalline diamond layer 308. Low pressure is believed to be beneficial to the formation of spa bonding in the second nanocrystalline diamond layer 308 from the remotely formed radicals. The higher pressure in the remote plasma source allows for preferential radical formation while the lower pressure in the process volume allows for more uniform deposition from the previously formed radicals. The second nanocrystalline diamond layer 308 has a smooth surface with a roughness (AFM) of less than about 15 nm.

Once the nanocrystalline diamond layer is deposited, a hydrogen containing gas is delivered to the remote plasma chamber. The hydrogen containing gas can be delivered at a separate time or the gas flow from the previous step can be maintained. No alkane precursor is present for this portion. The hydrogen containing gas can be delivered with an inert gas or as part of a combination of multiple hydrogen containing gases. In one or more embodiments, the hydrogen ($H_2$) gas is delivered with a flow rate of from about 1 sccm to about 94 sccm, including a range of from about 15 sccm to about 45 sccm.

The hydrogen containing gas is then activated to create an activated hydrogen containing gas. The hydrogen containing gas can be converted to a plasma using the same pressure, temperature, power type, power ranges and other parameters for formation of the plasma discussed with reference to forming the activated deposition gas.

Once the activated hydrogen containing gas is formed, it can be delivered to the substrate in the process volume. The process volume and the substrate may be maintained at the same pressure, temperature and other parameters as described above. During the deposition process, it is believed that polymers can form on the surface of the deposited nanocrystalline diamond layer. The polymers can affect further deposition and otherwise degrade performance of the deposited layer. By delivering the activated hydrogen containing gas to the deposited layer, the polymers are made volatile and can then be removed from the chamber, such that they do not affect subsequent deposition processes.

At decision point 506, it is determined whether the nanocrystalline hard mask 308 has achieved a predetermined roughness and thickness. Each deposition cycle produces a thickness of between about 20 Å and about 200 Å, such as about 100 Å. By repeating the above steps, the previous layer acts as a seed layer for the next deposition, allowing for an overall desired thickness to be deposited. In one embodiment, the nanocrystalline diamond stack is deposited to 1 μm thick.

If, at decision point 506, the nanocrystalline diamond stack is too rough or not thick enough, the cycle returns to operation 502 and 504 for further deposition steps.

If, at decision point 506, the nanocrystalline diamond stack has obtained the desired roughness and thickness, processing continues. At operation 508, the nanocrystalline diamond layer can, optionally, then be patterned and etched. Patterning can include deposition of a photoresist 112, 212 over the nanocrystalline diamond layer. The photoresist 112, 212 is then exposed to an appropriate wavelength of radiation to create a pattern of openings/apertures 111, 211. The pattern is then etched into both the photoresist 112, 212, and then the nanocrystalline diamond layer.

At operation 510, the device can then be etched to form a feature or channel. With the pattern formed in the nanocrystalline diamond layer, the device can then be etched. The device is etched by an etchant which is selective for the device layer 104, 106, 204, 206 over the nanocrystalline diamond layer 108, 208. The device layer is etched using chemistry and techniques well known in the art. In one embodiment, the etchant is a chlorine containing etchant.

At operation 512, the nanocrystalline diamond layer can then be removed from the surface of the device. The nanocrystalline diamond layer can be ashed, for example, from the surface of the device layer using a plasma ash process. The plasma ash process can include activating an oxygen-containing gas, such as $O_2$. When using $O_2$, the ash rate is about 900 Å/min or greater. The nanocrystalline diamond layer may be ashed using a high aspect ratio etch system.

Figure 6:
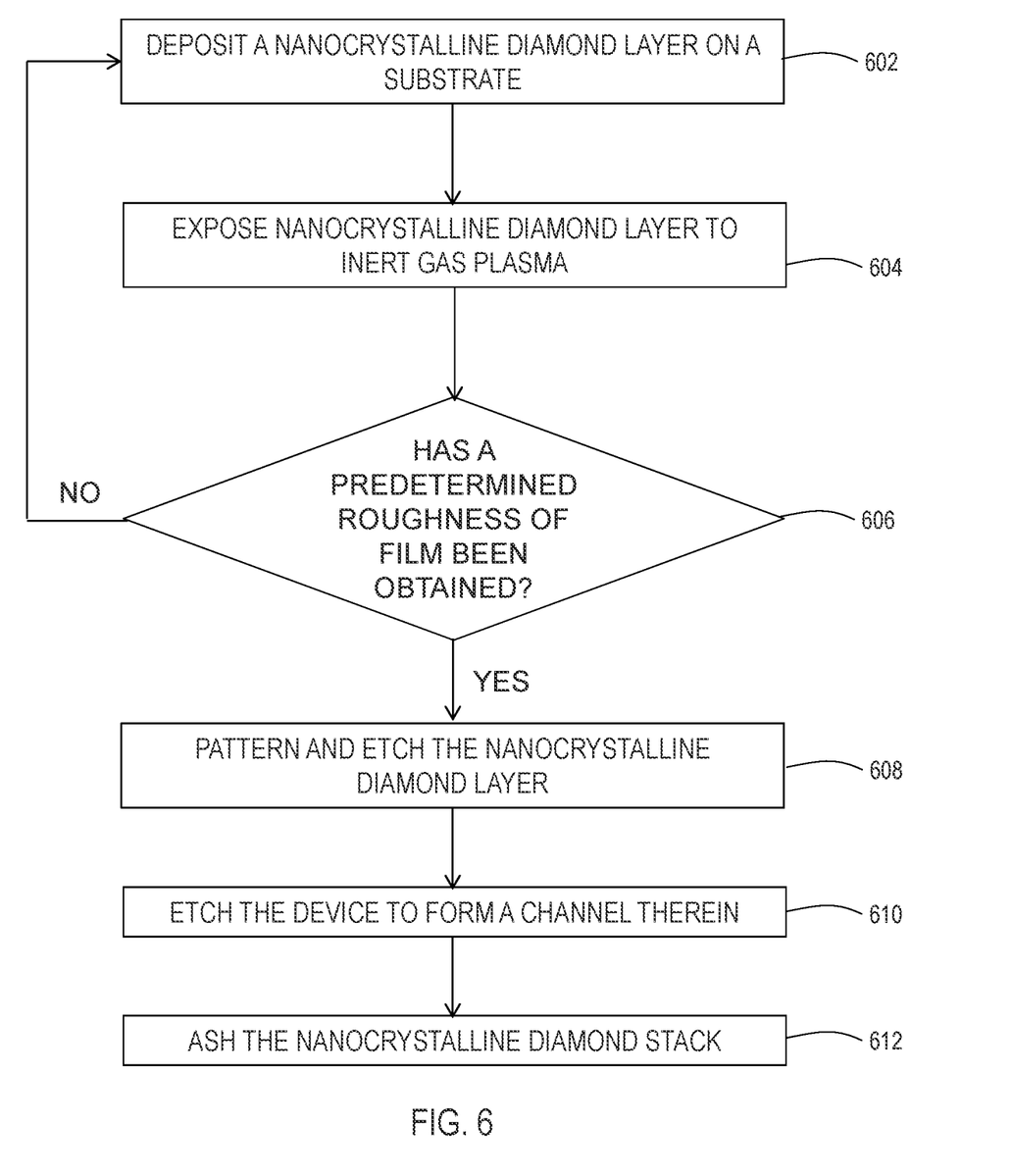
FIG. 6 illustrates a flow diagram of a method according to one or more embodiments.

FIGS. 4A-4D illustrate cross-sectional views of a device 400 being processed according to method of one or more embodiments. FIG. 6 illustrates a process flow diagram of a method 600 according to one or more embodiments. In some embodiments, a substrate is provided for processing prior to operation 602. As used in this regard, the term "provided" means that the substrate is placed into a position or environment for further processing. In one or more embodiments, the substrate is maintained at a temperature in a range of from about 500° C. to about 650° C.

A device layer can then be deposited on the processing surface. The device layer can be a device layer as described with reference to FIGS. 1A-1D and FIGS. 2A-2D. Further, the device layer can be one of a plurality of device layers. The device layers can act in conjunction to form one or more features or components, such as components of a 3D NAND device.

At operation 602, a nanocrystalline diamond layer is deposited on the substrate, or, in some embodiments, on the device layer. The nanocrystalline diamond layer can have an average grain size of less than 6 nm. In one example, the nanocrystalline diamond layer has an average grain size of between 2 nm and 5 nm. A small grain size, such as below 6 nm, allows for better control of adhesion between the hard mask layer, such as the nanocrystalline diamond layer, and the underlying layer and smaller size for the hard mask layer. The random positioning of a larger grain size during deposition will increase the number of non-contact spaces between the hard mask layer and the underlying layer. The non-contact space is the space between the hard mask layer and the underlying layer where the hard mask layer is not in direct contact with the underlying layer due to shape and size of the grains of the hard mask layer and due to the roughness of the underlying layer itself. A larger non-contact space decrease the adhesion of the layer and decreases the thermal transfer between the hard mask and the underlying layer. The size of non-contact space is reduced by smaller grains, because smaller grains, when deposited as part of a layer, can be more tightly packed than larger grains. Further, due to the smaller grain size, the layer can be made thinner than larger grain size layers while maintaining good contact with the underlying layer.

The deposition of the nanocrystalline diamond layer at operation 602 can begin by delivering a deposition gas to a CVD chamber (with a plasma source) at a first pressure. The deposition gas includes a carbon-containing precursor and a hydrogen containing gas. In one or more embodiments, the carbon-containing precursor is an alkane precursor. The alkane precursor can be a saturated unbranched hydrocarbon, such as methane, ethane, propane, and combinations thereof. Other alkane precursors include n-butane, n-pentane, n-hexane, n-heptane, n-octane, and combinations thereof. The hydrogen containing gas can include hydrogen ($H_2$), water ($H_2O$), ammonia ($NH_3$) or other hydrogen containing molecules.

The deposition gas is then delivered to the CVD chamber (with a plasma source). The deposition gas can either mix within the chamber or be mixed prior to entering the chamber. The deposition gas is delivered at a relatively high pressure, such as greater than 5 Torr. In one embodiment, the deposition gas is delivered at between about 10 Torr and 100 Torr, such as about 50 Torr.

The deposition gas can then be activated to create an activated deposition gas. The deposition gas can be activated by forming a plasma using a power source. Any power source capable of activating the gases into reactive species and maintaining the plasma of reactive species may be used. For example, radio frequency (RF), direct current (DC), or microwave (MW) based power discharge techniques may be used. The power source produces a source plasma power which is applied to the CVD chamber (with a plasma source) to generate and maintain a plasma of the deposition gas. In embodiments which use an RF power for the source plasma power, the source plasma power can be delivered at a frequency of from about 2 MHz to about 170 MHz and at a power level of between 500 W and 12,000 W. Other embodiments include delivering the source plasma power at from about 2000 W to about 12,000 W. The power applied can be adjusted according to size of the substrate being processed. In one or more embodiments, the microwave plasma is applied as a continuous wave at a range of power of from about 2 kilo watts (kW) to about 12 kilo watts (kW).

Based on the high pressure in the CVD chamber (with a plasma source), as well as other factors, ionized species formation will be minimized while radical formation is maximized. Without intending to be bound by theory, it is believed that the nanocrystalline diamond layer should be primarily $sp^3$ bonds rather than $sp^2$ bonds. Further, it is believed that more $sp^3$ bonding can be achieved by increasing the number of radical species over ionized species during the deposition of the layer. Ionized species are highly energetic can need more room for movement than radicals. By increasing the pressure, electron energy is reduced while the likelihood of collision with other molecules increases. The decrease in electron energy and increase in number of collisions favors radical formation over ion formation.

Once activated, the activated deposition gas is then delivered through a second volume having a second pressure. The second volume can be a second chamber or another confined area between the process volume and the remote plasma chamber. In one example, the second volume is the connection between the remote plasma chamber and the process volume.

The second pressure is less than the first pressure. The movement from the remote plasma chamber to the second volume either based on flow rate, change in overall volume or combinations thereof results in a reduced pressure of the activated deposition gas in the second volume. The pressure is reduced to allow for better deposition from the radical species while reducing ionized species collision with the deposited layer. In one embodiment, the second pressure is between about 0.1 Torr and about 5 Torr. In one or more embodiments, the second pressure is in a range of from about 0.1 Torr to about 1 Torr.

The activated deposition gas comprising methane ($CH_4$)/carbon dioxide ($CO_2$) at a range of flow rate of 2 sccm to 10 sccm is then delivered to a substrate in a process volume of a process chamber. The substrate can be of any composition, such as a crystalline silicon substrate. The substrate can also include one or more features, such as a via or an interconnect. The substrate can be supported on a substrate support. The substrate support can be maintained in a specific temperature range. In one embodiment, the substrate support is maintained in a temperature range of between about 500° C. and about 650° C.

Figure 4A:
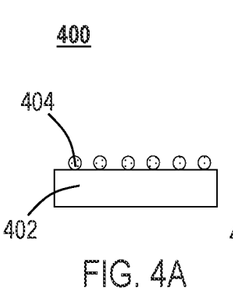
FIG. 4A illustrates a cross-sectional view of a substrate according to one or more embodiments.

As illustrated in FIG. 4A, the substrate 402 can be preseeded for deposition of the nanocrystalline layer. In one embodiment, the substrate 402 is immersed or otherwise coated in a seeding solution to form suspended nanodiamonds 404 on the substrate 402. The seeding solution may be an ethanol based nanodiamond suspension. The substrate 402 may be immersed in the suspension during an ultrasonic treatment, which adheres some of the suspended nanodiamonds 404 to the surface of the substrate 402. Other preseeding techniques can be employed without diverging from the embodiments described herein.

Figure 4B:
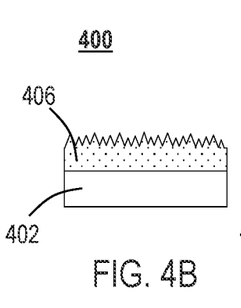
FIG. 4B illustrates a cross-sectional view of a substrate according to one or more embodiments.

Referring to FIG. 4B, a nanocrystalline diamond layer 406 is then deposited on a surface of the substrate 402. The radicals from the previously formed activated deposition gas impinge on the substrate surface to form the nanocrystalline diamond layer 406. Low pressure is believed to be beneficial to the formation of sp³ bonding in the nanocrystalline diamond layer 406 from the remotely formed radicals. The higher pressure in the remote plasma source allows for preferential radical formation while the lower pressure in the process volume allows for more uniform deposition from the previously formed radicals.

Once the nanocrystalline diamond layer 406 is deposited, a hydrogen containing gas is delivered to the CVD chamber (with a plasma source). The hydrogen containing gas can be delivered at a separate time or the gas flow from the previous step can be maintained. No alkane precursor is present for this portion. The hydrogen containing gas can be delivered with an inert gas or as part of a combination of multiple hydrogen containing gases. In one or more embodiments, the hydrogen (H₂) gas is delivered with a range of flow rate of 90 sccm to 96 sccm.

The hydrogen containing gas is then activated to create an activated hydrogen containing gas. The hydrogen containing gas can be converted to a plasma using the same pressure, temperature, power type, power ranges and other parameters for formation of the plasma discussed with reference to forming the activated deposition gas.

Once the activated hydrogen containing gas is formed, it can be delivered to the substrate in the process volume. The process volume and the substrate may be maintained at the same pressure, temperature and other parameters as described above. During the deposition process, it is believed that polymers can form on the surface of the deposited nanocrystalline diamond layer. The polymers can affect further deposition and otherwise degrade performance of the deposited layer. By delivering the activated hydrogen containing gas to the deposited layer, the polymers are made volatile and can then be removed from the chamber, such that they do not affect subsequent deposition processes.

Figure 4C:
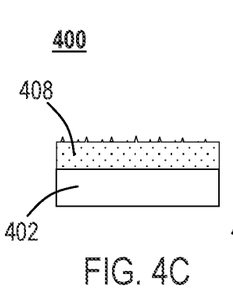
FIG. 4C illustrates a cross-sectional view of a substrate according to one or more embodiments.

With reference to FIG. 4C and FIG. 6, at operation 604, the nanocrystalline diamond layer 406 is exposed to an inert gas plasma to form a smooth surface nanocrystalline diamond layer 408. In one or more embodiments, the gas flow comprises an inert gas selected from one or more of helium (He), neon (Ne), and argon (Ar). In one or more specific embodiments, the inert gas plasma comprises argon (Ar), delivered with a range of flow rate of about 50 sccm to about 200 sccm, pulsed with microwave power in a range of from about 2 kW to about 12 kW at 10-90%, a pressure in a range of from about 0.1 Torr to about 1 Torr, and at a temperature in a range of from about 500° C. to about 650° C.

The inert gas is then delivered to the remote plasma chamber. The inert gas is delivered at a relatively high pressure, such as greater than 5 Torr. In one embodiment, the inert gas is delivered at between about 10 Torr and 100 Torr, such as about 50 Torr.

The inert gas can then be activated to create an activated inert gas. The inert gas can be activated by forming a plasma using a power source. Any power source capable of activating the gases into reactive species and maintaining the plasma of reactive species may be used. For example, radio frequency (RF), direct current (DC), or microwave (MW) based power discharge techniques may be used. The power source produces a source plasma power which is applied to the CVD chamber (with a plasma source) to generate and maintain a plasma of the inert gas. In embodiments which use an RF power for the source plasma power, the source plasma power can be delivered at a frequency of from about 2 MHz to about 170 MHz and at a power level of between 500 W and 12,000 W. Other embodiments include delivering the source plasma power at from about 2000 W to about 12,000 W. The power applied can be adjusted according to size of the substrate being processed.

Based on the high pressure in the CVD chamber (with a plasma source), as well as other factors, ionized species formation will be minimized while radical formation is maximized, leading to a smoothing of the surface of the nanocrystalline diamond layer 406 surface to form a smoothened nanocrystalline diamond layer 408.

Once activated, the activated inert gas comprising argon (Ar) at a range of flow rate of about 50 sccm to about 200 sccm is then delivered through a second volume having a second pressure. The second volume can be a second chamber or another confined area between the process volume and the remote plasma chamber. In one example, the second volume is the connection between the remote plasma chamber and the process volume.

The second pressure is less than the first pressure. The movement from the remote plasma chamber to the second volume either based on flow rate, change in overall volume or combinations thereof results in a reduced pressure of the activated deposition gas in the second volume. The pressure is reduced to allow for better deposition from the radical species while reducing ionized species collision with the deposited layer. In one embodiment, the second pressure is between about 0.1 Torr and about 5 Torr. In one or more embodiments, the second pressure is in a range of from about 0.1 Torr to about 1 Torr.

The activated inert gas is then delivered to the nanocrystalline diamond layer 406 in a process volume of a process chamber with a range of flow rate of about 50 sccm to about 200 sccm. In one embodiment, the substrate support is maintained in a temperature range of between about 500° C. and about 650° C.

The smooth nanocrystalline diamond layer 408 has a smooth surface with a roughness (AFM) of less than about 15 nm.

At decision point 606, it is determined whether the smooth nanocrystalline hard mask 408 has achieved a predetermined roughness and thickness. Each deposition cycle produces a thickness of between about 20 Å and about 200 Å, such as about 100 Å. By repeating the above steps, the previous layer acts as a seed layer for the next deposition, allowing for an overall desired thickness to be deposited. In one embodiment, the nanocrystalline diamond stack is deposited to 1 μm thick.

Figure 4D:
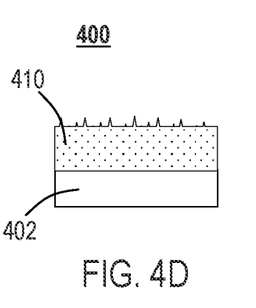
FIG. 4D illustrates a cross-sectional view of a substrate according to one or more embodiments.

If, at decision point 606, the nanocrystalline diamond stack is too rough or not thick enough, the cycle returns to operation 602 and 604 for further deposition and smoothing steps to result in a thick and smooth nanocrystalline diamond stack 410 (see FIG. 4D).

If, at decision point 606, the nanocrystalline diamond stack has obtained the desired roughness and thickness, processing continues. At operation 608, the nanocrystalline diamond layer can, optionally, then be patterned and etched. Patterning can include deposition of a photoresist 112, 212 over the nanocrystalline diamond layer. The photoresist 112, 212 is then exposed to an appropriate wavelength of radiation to create a pattern of openings/apertures 111, 211. The pattern is then etched into both the photoresist 112, 212, and then the nanocrystalline diamond layer.

At operation 610, the device can then be etched to form a feature or channel. With the pattern formed in the nanocrystalline diamond layer, the device can then be etched. The device is etched by an etchant which is selective for the device layer 104, 106, 204, 206 over the nanocrystalline diamond layer 108, 208. The device layer is etched using chemistry and techniques well known in the art. In one embodiment, the etchant is a chlorine containing etchant.

At operation 612, the nanocrystalline diamond layer can then be removed from the surface of the device. The nanocrystalline diamond layer can be ashed, for example, from the surface of the device layer using a plasma ash process. The plasma ash process can include activating an oxygen-containing gas, such as $O_2$. When using $O_2$, the ash rate is about 900 Å/min or greater. The nanocrystalline diamond layer may be ashed using a high aspect ratio etch system.

In the foregoing specification, embodiments of the disclosure have been described with reference to specific exemplary embodiments thereof. It will be evident that various modifications may be made thereto without departing from the broader spirit and scope of the embodiments of the disclosure as set forth in the following claims. The specification and drawings are, accordingly, to be regarded in an illustrative sense rather than a restrictive sense.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A memory device comprising:
   a memory stack comprising a plurality of alternating layers of a first material and a second material on a substrate;
   a first nanocrystalline diamond layer on the memory stack, the first nanocrystalline diamond layer having a first thickness, a first roughness of greater than about 25 nm, a first hardness, an $sp^3$ content of greater than 80%, and a crystal size in a range of from 2 nm to 5 nm;
   a second nanocrystalline diamond layer on the first nanocrystalline diamond layer, the second nanocrystalline diamond layer having a second thickness, an $sp^3$ content of greater than 80%, a crystal size in a range of from 2 nm to 5 nm, and a second roughness of less than about 15 nm; and
   a memory channel extending from a top surface of the memory stack to the substrate.

2. The memory device of claim 1, wherein the first thickness of the first nanocrystalline diamond layer is in a range of from about 250 nm to about 650 nm.

3. The memory device of claim 1, wherein the second thickness of the second nanocrystalline diamond layer is in a range of from about 5 nm to about 200 nm.

4. The memory device of claim 1, wherein the memory device is a vertically stacked NAND device.

5. The memory device of claim 1, further comprising an anti-reflective coating on the second nanocrystalline diamond layer.

6. The memory device of claim 5, further comprising a photoresist on the anti-reflective coating.

\* \* \* \* \*

UNITED STATES PATENT AND TRADEMARK OFFICE
CERTIFICATE OF CORRECTION

PATENT NO. : 11,894,230 B2
APPLICATION NO. : 18/101317
DATED : February 6, 2024
INVENTOR(S) : Vicknesh Sahmuganathan et al.

It is certified that error appears in the above-identified patent and that said Letters Patent is hereby corrected as shown below:

In the Specification

Column 5, Line 51, replace "spa" after "modules (e.g., higher" and before "content) with" with "$sp^3$".

Signed and Sealed this
Twenty-sixth Day of March, 2024

*Katherine Kelly Vidal*
*Director of the United States Patent and Trademark Office*